United States Patent [19]
Anderson

[11] Patent Number: 4,945,259
[45] Date of Patent: Jul. 31, 1990

[54] BIAS VOLTAGE GENERATOR AND METHOD

[75] Inventor: Thomas R. Anderson, Tucson, Ariz.

[73] Assignee: Burr-Brown Corporation, Tucson, Ariz.

[21] Appl. No.: 269,867

[22] Filed: Nov. 10, 1988

[51] Int. Cl.$^5$ .......................... H03K 3/01; G05F 3/16; H03F 3/04

[52] U.S. Cl. .............................. 307/296.1; 307/296.6; 307/296.7; 307/270; 323/313; 323/315; 330/296

[58] Field of Search ............... 307/296.1, 296.3, 296.5, 307/296.6, 296.8, 297, 270; 323/312, 313, 315, 316; 330/257, 288, 296

[56] References Cited

U.S. PATENT DOCUMENTS

| | | | |
|---|---|---|---|
| 3,174,095 | 3/1965 | Cocker | 323/22 |
| 3,192,403 | 6/1965 | Bernfeld et al. | 307/88.5 |
| 3,681,623 | 8/1972 | Hoffman, Jr. et al. | 307/297 |
| 3,935,478 | 1/1976 | Okada et al. | 307/296.1 |
| 3,990,017 | 11/1976 | Ahmed | 330/296 |
| 4,004,243 | 1/1977 | Sheng | 330/22 |
| 4,093,907 | 6/1978 | Nutz | 323/316 |
| 4,317,081 | 2/1982 | Kobayashi | 330/268 |
| 4,485,313 | 11/1984 | Nagano | 307/296.1 |
| 4,571,536 | 2/1986 | Kuwahara | 307/296.6 |

Primary Examiner—Stanley D. Miller
Assistant Examiner—Trong Quang Phan
Attorney, Agent, or Firm—Cahill, Sutton & Thomas

[57] ABSTRACT

A circuit for producing a reference voltage includes an NPN transistor having its emitter connected to a first terminal, its collector connected to a second terminal, a PNP transistor having its emitter connected to the second terminal, its base connected to the base of the NPN transistor, and having its collector connected to the second terminal. A current source is connected to either the first terminal or the second terminal to force a current which is divided into a current through the PNP transistor and another current through the NPN transistor. The circuit produces a reference voltage equal to the sum of the PNP $V_{BE}$ voltage and the NPN $V_{BE}$ voltage. The reference voltage tracks precisely with variations in saturation currents of the PNP transistor and the NPN transistor. The circuit is useful in producing a two $V_{BE}$ bias voltage between the base of an NPN pullup transistor and a PNP pulldown transistor having a common emitter connection to an output terminal. The circuit produces a constant quiescent bias current in the NPN pullup transistor and the PNP pulldown transistor that is substantially independent of variations in the saturation currents of the PNP transistor and the NPN transistor.

17 Claims, 2 Drawing Sheets

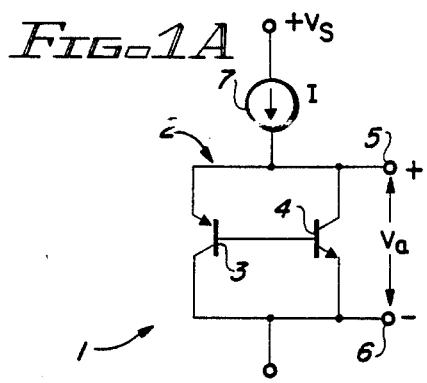
FIG.-1A
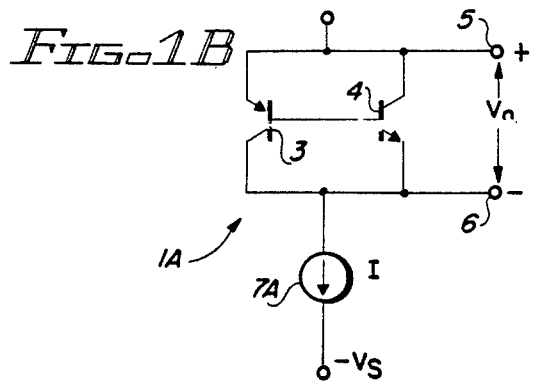
FIG.-1B
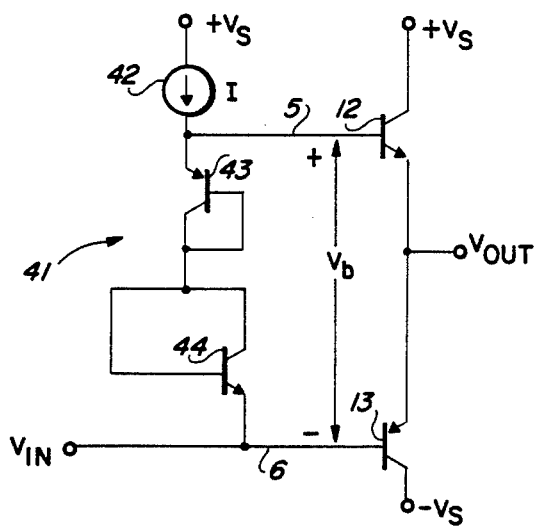
FIG.-2A (PRIOR ART)
FIG.-2B (PRIOR ART)
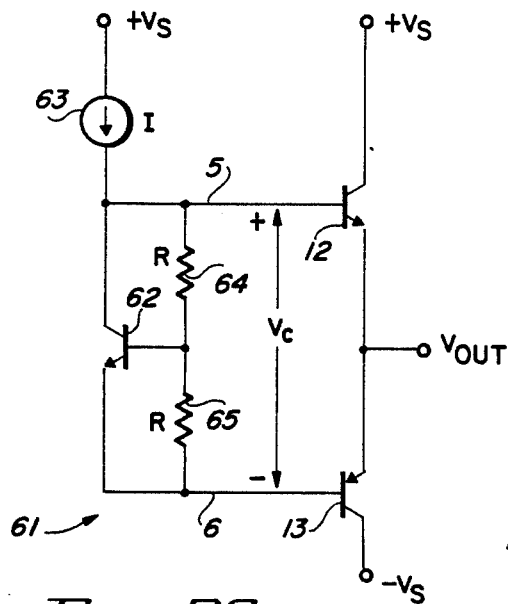
FIG.-2C (PRIOR ART)
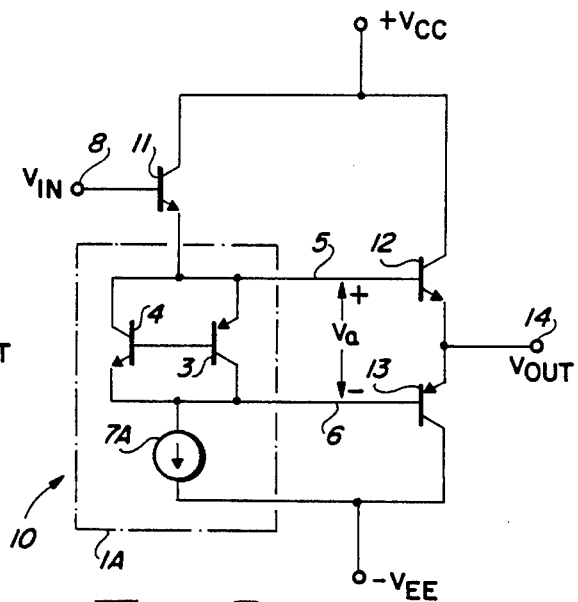
FIG.-3

BIAS VOLTAGE GENERATOR AND METHOD

BACKGROUND OF THE INVENTION

The invention relates to high precision bias voltage generating circuits, especially those useful in biasing push-pull driver circuits, diamond follower circuits, certain level shifting circuits, and certain diode-switching circuits.

There are a number of well-known circuits for biasing push-pull driver circuits that contain an NPN pullup transistor and a PNP pulldown transistor each having its emitter connected to the same output conductor. One such biasing circuit is shown in FIG. 2A, in which a diode-connected PNP transistor 43 is connected in series with a diode-connected NPN transistor 44. This series-connected pair of transistors is coupled between the base of NPN pullup transistor 12 and the base of PNP pulldown transistor 13. The current through current source 42 flows through both transistors 43 and 44, producing a voltage $V_b$ equal to $V_{BE}(43)$ plus $V_{BE}(44)$ between conductors 5 and 6, which are connected to the bases of NPN transistor 12 and PNP transistor 13. The input voltage $V_{IN}$ is applied to conductor 6. The prior art circuit of FIG. 2A requires operation of the diode-connected transistors with zero collector to-base voltage. For linear operation of the circuit, it is essential that the internal collector-base junction not become substantially forward biased. This requires that the internal collector resistance be small, which in turn requires relatively large emitter area and collector contact area to prevent the internal forward base-to-collector bias voltage from exceeding approximately 200 millivolts. The internal forward bias of the collector-base junction also increases the collector-base junction capacitance, contributing to degradation of the circuit's bandwidth.

FIG. 2B shows another known technique using an NPN source follower 52 to drive the base of the PNP pulldown transistor 13 and a PNP source follower 54 to drive the base of the NPN pullup transistor 12. In FIG. 2B, the difference between the output voltages of the NPN source follower 52 and the PNP source follower 54 provides a voltage Vd equal to the sum of $V_{BE}(54)$ and $V_{BE}(52)$ to bias output transistors 12 and 13. This circuit dissipates more power than is desirable because separate current sources I are required for the two source followers. Another problem with the circuit of FIG. 2B is that the emitter follower transistors are usually scaled to the output transistors to control quiescent current in the output stage. In many amplifiers, this results in a large nonlinear collector-base capacitance on the input node and causes distortion and reduced bandwidth.

FIG. 2C discloses use of a so-called "$V_{BE}$ multiplier" as a bias circuit coupled between the base of NPN pullup transistor 12 and PNP pulldown transistor 13. The $V_{BE}$ multiplier circuit produces a voltage $V_c$ between conductors 5 and 6 that is equal to the $V_{BE}$ voltage of NPN transistor 62 times a quantity that is a function of the resistances R of resistors 64 and 65. The $V_{BE}$ multiplier circuit, however, does not accurately control the bias current because the current in the $V_{BE}$ multiplier transistor is controlled by both the base-to-emitter voltage of the $V_{BE}$ multiplier transistor 62 and the resistance of the two resistors 64 and 65. Since these quantities are controlled by different process variables in the manufacture of an integrated circuit, the bias current produced by the $V_{BE}$ multiplier in FIG. 2C is not as accurately controlled and process-independent as is desirable.

U.S. Pat. No. 4,317,081 (Kobayashi) discloses a single ended push-pull power amplifier in which the PNP transistor Q9 has its base connected to the base of an NPN transistor Q10. The emitter of Q9 is connected to the collector of Q10 and the emitter of Q10 is connected to the collector of Q9. A resistor R5 is connected between the base and emitter of Q9 and a resistor R6 is connected between the base and emitter of Q10. This circuit is used between a bias circuit 12 and a complementary push-pull output circuit Q7,Q8 to improve high frequency performance by discharging charge stored in the output transistors Q7,Q8. The bias circuit 12 applies a bias voltage to the bases of the push-pull output circuit Q7,Q8 and across the two resistors R5 and R6 and transistors Q9 and Q10. This circuit has the disadvantage that resistors R5 and R6 require a large amount of chip area and their resistances are controlled by different process parameters than the $V_{BE}$ voltages of transistors Q9 and Q10. Consequently, an imbalance in the resistances of those resistors would result in large differences in the currents flowing through the two transistors, causing substantial undesired process-dependent variations in the bias voltage produced by the circuit.

It would be desirable to provide a bias circuit which provides a very precise bias voltage equal to the sum of the $V_{BE}$ voltages of a PNP pullup transistor and an NPN pulldown transistor with a common emitter connection. The matching of the bias voltage to the sum of the $V_{BE}$ voltages should be essentially independent of the saturation currents of the NPN and PNP transistors.

SUMMARY OF THE INVENTION

Accordingly, it is an object of the invention to provide a bias circuit for generating a voltage equal to the sum of a PNP $V_{BE}$ voltage and an NPN $V_{BE}$ voltage, using a minimum amount of semiconductor chip area, having minimum capacitance, low dynamic impedance, and not dependant upon any resistor value variations.

It is another object of the invention to provide an improved circuit useful for producing a process-independent bias current in a complementary push-pull output transistor stage.

Briefly described, and in accordance with one embodiment thereof, the invention provides a circuit for producing a reference voltage including an NPN transistor having its emitter connected to a first terminal, its collector connected to a second terminal, a PNP transistor having its emitter connected to the second terminal, its base connected solely to the base of the NPN transistor, and having its collector connected to the first terminal. A current source is connected to either the first terminal or the second terminal to force a current which divides into a current through the PNP transistor and another current through the NPN transistor. The circuit produces a reference voltage equal to the sum of the PNP $V_{BE}$ voltage and the NPN $V_{BE}$ voltage which tracks precisely with variations in saturation currents of the PNP transistor and the NPN transistor. The circuit is useful in producing a two $V_{BE}$ bias voltage between the base of an NPN pullup transistor and a PNP pulldown transistor having a common emitter connection to an output terminal. The circuit produces a constant quiescent bias current in the NPN pullup transistor and the PNP pulldown transistor that is substantially independent of variations in the saturation currents of the PNP transistor and the NPN transistor. The $2V_{BE}$ voltage produced also can be useful in certain level-shifting applications where low dynamic impedance and minimum capacitance are required.

BRIEF DESCRIPTION OF THE DRAWINGS

FIG. 1A is a schematic diagram of one configuration of the reference voltage circuit of the present invention.

FIG. 1B is a schematic diagram of another configuration of the reference voltage circuit of the present invention.

FIGS. 2A-2C are circuit diagrams of prior art circuits.

FIG. 3 is a schematic circuit diagram of an output circuit stage using the voltage reference circuit of FIG. 1.

DETAILED DESCRIPTION OF THE PREFERRED EMBODIMENTS OF THE INVENTION

Figure 4:
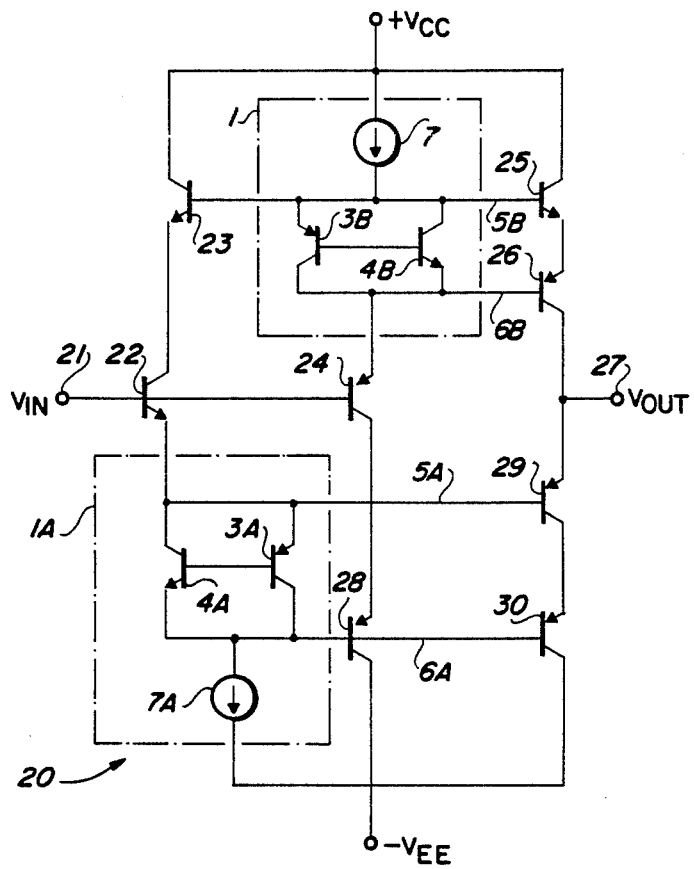
FIG. 4 is a schematic circuit diagram of a diamond follower circuit utilizing two of the reference voltage circuits of FIGS. 1A and 1B.

In FIG. 1A, one basic configuration of the reference voltage circuit of the invention is designated by reference numeral 1, and includes a current source 7 coupled between $+V_S$ and conductor 5 and producing a current I. A PNP transistor 3 has its emitter connected to conductor 5 and its collector connected to conductor 6. An NPN transistor 4 has its collector connected to conductor 5, its base connected to the base of transistor 3, and its emitter connected to conductor 6. When current I flows into conductor 5, it is split between transistors 3 and 4, and produces a voltage $V_a$ equal to $V_{BE3}$ and $V_{BE4}$, where $V_{BE3}$ is the magnitude of the base-to-emitter voltage of PNP transistor 3 and $V_{BE4}$ is the magnitude of the base-to-emitter voltage of NPN transistor 4.

In FIG. 1B, an alternate configuration 1A of the reference voltage circuit of the invention is identical to that of FIG. 1A except the current source 7A is coupled between a negative supply voltage conductor having $-V_S$ volts thereon. For either circuit 1 or 1A, the current source circuit 7 or 7A can be any suitable well known current source circuit, or even a resistor. Both circuit 1 and 1A distinguish over the above mentioned patent No. 4,317,081 by omitting resistors between the bases of transistors 3 and 4 and conductors 5 and 6, and also by connecting a current source in series with the parallel connection of transistors 3 and 4 instead of applying a bias voltage circuit across them.

For either the circuit of FIG. 1A or FIG. 1B, it can be seen that $V_a$ is given by the equation $$V_a = V_{TH}\ln\left(\frac{I_n}{I_{sn}}\right) + V_{TH}\ln\left(\frac{I_p}{I_{sp}}\right) \quad (1)$$

where $V_{TH}$ equals $(kT)/q$. Equation (1) can be rearranged as equation $$V_a = V_{TH}\ln\left(\frac{I_n I_p}{I_{sn} I_{sp}}\right). \quad (2)$$

In equations 1 and 2, $I_n$ is the portion of the current I flowing through NPN transistor 4 and $I_p$ is the current flowing through PNP transistor 3. $I_{sn}$ is the saturation current of NPN transistor 4 and $I_{sp}$ is the saturation current of PNP transistor 3.

The expression for the voltage $V_b$ of the prior art voltage reference circuit of FIG. 2A including current source 42, diode connected transistor 43, and diode connected transistor 44 is given by the equation $$V_b = V_{TH}\ln\left(\frac{I^2}{I_{sn} I_{sp}}\right). \quad (3)$$

To compare $V_b$ to $V_a$, it can be assumed, for simplification, that the current I splits equally between PNP transistor 3 and NPN transistor 4 in the circuits of FIGS. 1A and 1B. If this assumption is made, this leads to the following equation for $V_a$ $$V_a = V_{TH}\ln\left[\frac{\left(\frac{I}{2}\right)^2}{I_{sn} I_{sp}}\right]. \quad (4)$$

Thus, it can be seen if that $V_a$ and $V_b$ are equal, then the current through each of PNP transistor 3 and NPN transistor 4 of FIG. 1A or FIG. 1B can be one-half the current through diode-connected transistors 43 and 44 of FIG. 2A. Assuming the same value of the current I in FIGS. 1A and 2A, and also assuming equal value of $V_a$ and $V_b$, then emitter areas (and hence the reverse saturation currents) of transistors 3 and 4 of FIG. 1A can be one-half the emitter areas of transistors 43 and 44 of FIG. 2A, respectively. This can result in a substantial savings in integrated circuit chip area. The reduction in required size of PNP transistor 3 and NPN transistor 4 to produce a value of $V_a$ results in collector-base capacitances which are reduced by a factor of 2. This can substantially increase the bandwidth of the circuit.

Another advantage of the circuits of FIGS. 1A and 1B over the bias circuit 43,44 of FIG. 2A is that in the latter, the collectors and bases of the diode-connected transistors are connected together. Consequently, the collector-base junction capacitance has its maximum value, while in the bias circuits of FIGS. 1A and 1B the collector-base junctions are reversed biased by approximately 0.7 volts, substantially reducing the collector-base junction capacitances and thereby providing improved dynamic circuit performance over the circuit of FIG. 2A. Furthermore, for a given value of current I in the circuit of FIG. 2A, the transistors 43 and 44 need to be sufficiently large that their internal collector resistance is sufficiently small to prevent internal forward biasing of the collector-base junctions of diode-connected transistors 43 and 44 when the current I flows through them. Forward biasing the collector-base junctions would result in excessive charge storage in the base regions, which would seriously degrade dynamic performance. Furthermore, if the forward bias of the internal collector-to-base junction of diode-connected transistor 43 or 44 becomes greater than about 200 millivolts, the voltage $V_B$ will no longer have its correct value, and consequently the bias current in NPN pullup transistor 12 and PNP pulldown transistor 13 will no longer have its correct value. This condition results in undesirable distortion of the output voltage $V_{OUT}$. To avoid these problems if the circuit of FIG. 2A is used, it may be necessary to substantially increase both the emitter areas and collector contact areas of transistors 43 and 44, further increasing chip size and further degrading dynamic performance.

Referring to FIG. 3, the circuit of FIG. 1B is shown with conductor 5 connected to the base of NPN pullup transistor 12 and conductor 6 connected to the base of PNP pulldown transistor 13. The collector of transistor 13 is connected to $-V_{EE}$, and current source 7A is connected between conductor 6 and $-V_{EE}$. The collector of pullup transistor 12 is connected to $+V_{CC}$. An emitter follower NPN transistor 11 having its base connected by conductor 8 to an input voltage $V_{IN}$ has its emitter connected to conductor 5 and its collector connected to $+V_{CC}$.

The circuit of FIG. 3 dissipates power in only one emitter follower, rather than two, as required by the circuit of FIG. 2B in order to maintain a preselected bias current in output transistors 12 and 13. (Note that in the circuit of FIG. 2B, the emitter follower transistors 52 and 54 must be twice the physical size of transistors 3 and 4 in FIG. 3 for the same current I. This results in larger collector-base parasitic capacitances, which limit bandwidth of the circuit of FIG. 2B.)

The circuit of FIG. 3 provides a very good way of biasing a push-pull NPN, PNP output stage because the physical size of transistors 3 and 4 needed to produce a certain value of bias current in output transistors 12 and 13 is one-half that for any known prior bias circuit through which the same total current I flows. Also, the circuit of FIG. 3 provides buffering between $V_{IN}$ and $V_{OUT}$ just as effectively as the circuit of FIG. 2B, but with only half of the power dissipation and half of the collector-base parasitic capacitance. The saturation current characteristics of transistors 3 and 4 precisely match the characteristics of output transistors 12 and 13, respectively. Consequently, no laser trimming of resistors or the like is required to adjust the quiescent bias current produced through transistors 12 and 13, since precise matching or scaling of geometries of NPN transistors 4 and 12 and of PNP transistors 3 and 13 ca be achieved easily in the integrated circuit layout stage of design. Transistor 11 in FIG. 3 may be a very small device, so as to minimize the effects of nonlinear collector-base capacitance at the input node 8.

It should be noted that if emitter follower transistor 11 is omitted, $V_{IN}$ can be applied to conductor 5.

The expression for the bias voltage $V_c$ produced by the $V_{BE}$ multiplier circuit of FIG. 2C is given by equation $$V_c = 2V_{TH}\ln\left[\frac{I}{I_{sn}}\right],\tag{5}$$

where $I_{sn}$ is the saturation current of NPN transistor 62. (Note that in FIGS. 2A-2C, the base currents of output transistors 12 and 13 are assumed to be negligible.)

Since the current in NPN transistor 52 is controlled by both the $V_{BE}$ voltage of transistor 62 and the value of R, which is the resistance of resistors 64 and 65, it is very difficult to match $V_c$ to the characteristics of output transistors 12 and 13 sufficiently closely to provide the desired quiescent bias current through output transistors 12 and 13 without laser trimming or otherwise adjusting the resistance of resistors 54 and/or 55.

Thus, it can be readily seen that a major advantage of the bias circuit of FIGS. 1A and 1B over the $V_{BE}$ multiplier circuit of FIG. 2C is that no such adjustment or laser trimming is ever required for the bias circuits of FIGS. 1A and 1B, because the quiescent bias current through output transistors 12 and 13 would be controlled by matching or scaling between NPN pullup transistor 12 and NPN transistor 4 and similarly by matching or scaling between PNP pulldown transistor 13 and PNP transistor 3 if the circuit of FIG. 1A or 1B is used to provide the bias current for the push pull output circuit 12,13.

Figure 5A:
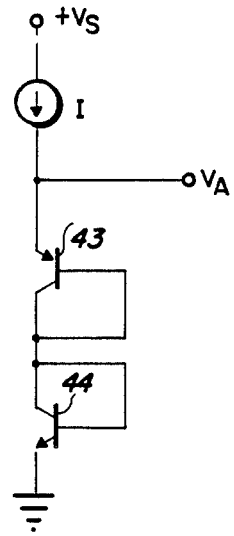
FIGS. 5A and 5B are circuit diagrams useful in analyzing the circuit of FIG. 1 and comparing it with the prior art.

Equations (3) and (4) above assume that the current I splits equally between PNP transistor 3 and NPN transistor 4. However, if this assumption is not valid, then accurate equations can be based on the circuit shown in FIG. 5A for the above described type of diode-connected transistor bias circuit and on the circuit shown in FIG. 5B for the bias circuit of the present invention. For the series connection of diode-connected PNP transistor 43 and diode-connected NPN transistor 44 of FIG. 5A the voltage VA is given by equation $$V_A = \frac{kT}{q}\ln\left[\frac{I^2}{I_{sp}I_{sn}}\right]\tag{6}$$

Figure 5B:
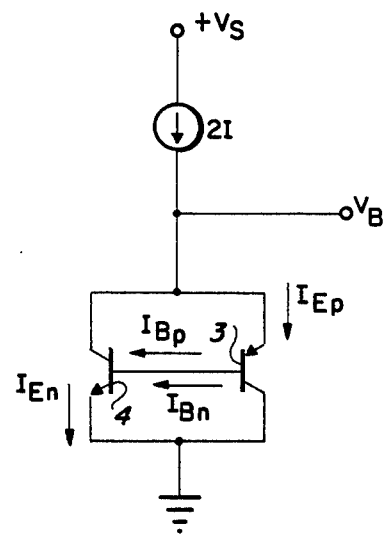

For the circuit of FIG. 5B, $V_B$ is $$V_B = V_{TH}\ln\left(\frac{I_{Ep}}{I_{sp}}\right) + V_{TH}\ln\left(\frac{I_{En}}{I_{sn}}\right).\tag{7}$$

Since the base electrodes are connected only to each other, the base currents are equal, i.e., $$I_{Bp} = I_{Bn}\tag{8}$$

Since $$I_{Bp} = \frac{I_{Ep}}{\beta_p + 1} \text{ and } I_{Bn} = \frac{I_{En}}{\beta_n + 1},$$

where $\beta_p$ and $\beta_n$ are the ratios of collector current to base current for the PNP and NPN transistors, respectively, and since $\beta_p$ and $\beta_n$ are much greater than 1, it follows that $$\frac{I_{Ep}}{\beta_p + 1} = \frac{I_{En}}{\beta_n + 1}\tag{9}$$

and $$\frac{I_{Ep}}{I_{En}} \simeq \frac{\beta_p}{\beta_n}.\tag{10}$$

From FIG. 5B, it is apparent that $$2I = I_{Ep} + I_{Cn} = I_{En} + I_{Cp}.\tag{11}$$

Since $I_{Cn} \simeq I_{En}$, then $$2I \simeq I_{Ep} + I_{En}.\tag{12}$$

-continued

Since from equation (10), $I_{Ep} = \frac{\beta_p I_{En}}{\beta_n}$, then it follows that $$2I = I_{En}\left(1 + \frac{\beta_p}{\beta_n}\right) = I_{En}\left(\frac{\beta_p + \beta_n}{\beta_n}\right). \tag{13}$$

Substituting $I_{Ep} = \frac{I_{En}\beta_p}{\beta_n}$ into equation (7) results in $$V_B = V_{TH}\ln\left[\frac{1}{I_{sp}I_{sn}}\left(\frac{\beta_p I_{En}^2}{\beta_n}\right)\right]. \tag{14}$$

Since from equation (13), $I_{En} = \frac{\beta_n 2I}{\beta_p + \beta_n}$, substituting this value of $I_{En}$ into equation (14) leads to $$V_B = V_{TH}\ln\left[\frac{1}{I_{sp}I_{sn}}\left(\frac{\beta_p \beta_n^2 4I}{\beta_n(\beta_p + \beta_n)^2}\right)\right]. \tag{15}$$

Therefore $$V_B = V_{TH}\ln\left[\frac{I^2 4\beta_n}{I_{sp}I_{sn}(\beta_p + \beta_n)^2}\right]. \tag{16}$$

If $\beta_n$ is set equal to $k\beta_p$, then equation (16) becomes $$V_B = V_{TH}\ln\left[\frac{I^2 4k}{I_{sp}I_{sn}(1 + k)^2}\right]. \tag{17}$$

This can be expanded into $$V_B = V_{TH}\ln\left[\frac{I^2}{I_{sp}I_{sn}}\right] + V_{TH}\ln\left[\frac{4k}{(1 + k)^2}\right], \text{ where } k \text{ is} \tag{18}$$

the ratio between $\beta_n$ and $\beta_p$.

If k is equal to 1, i.e., $\beta_n$ and $\beta_p$ are equal, the second term of equation (18) is zero. However, for unequal $\beta_p$ and $\beta_n$, the second term is not equal to zero. For example, if $\beta_p = 50$ and $\beta_n = 500$, then the second term of equation (18) is $-28.5$ millivolts at room temperature.

Figure 6:
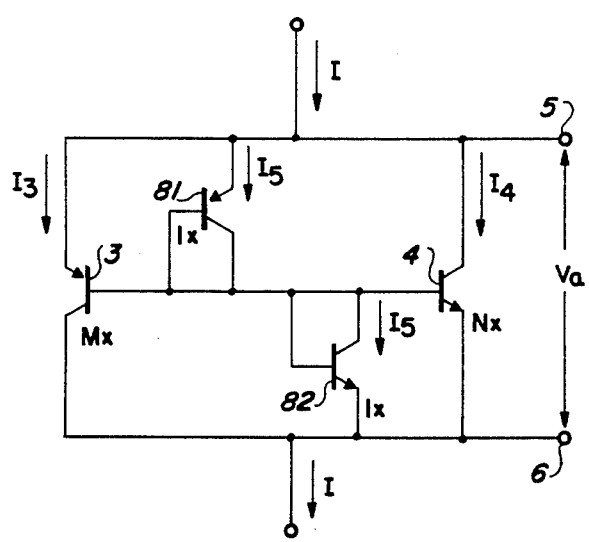
FIG. 6 is a circuit diagram of an alternate embodiment of the invention.

FIG. 6 shows a variation of the $2V_{BE}$ circuit portions of FIGS. 1A and 1B, wherein a PNP transistor 81 has its base and collector connected to the bases of transistors 3 and 4 and its emitter connected to conductor 5. An NPN transistor 82 has its base and collector connected to the base of transistors 3 and 4 and its emitter connected to conductor 6. As in FIGS. 1A and 1B, no resistors are connected between the bases of transistors 3 and 4 and either of conductors 5 and 6. The emitter areas of transistors 81 and 82 are equal to x. The emitter area of transistor 3 is Mx, and the emitter area of transistor 4 is Nx.

It can be seen that transistors 81 and 82 force the currents I3 and I4 to be independent of $\beta_n$ and $\beta_p$, and to be controlled by the values of M and N. This can be understood by realizing that transistors 81 and 3 form a first current mirror in which I3 is equal to MI5 and transistors 82 and 4 form a second current mirror in which I4 is equal to NI5.

FIG. 4 shows a modified diamond follower circuit in which the bias circuits of FIGS. 1A and 1B are used to ensure uniform constant (i.e., independent of $V_{IN}$) collector-base voltages on the signal carrying transistors 22, 24, 26, and 29. This results in low distortion which otherwise might result from nonlinearities of the collector-base capacitances. In FIG. 4, the bias circuit 1 has an output terminal 5B connected to the bases of NPN transistors 23 and 25, the collectors of which are connected to $+V_{CC}$. Bias circuit 1 has its other output terminal 6B connected to the base of NPN transistor 26 and the emitter of PNP transistor 24. The collector of transistor 26 is connected to the emitter of transistor 25. The emitter of transistor 26 is connected to $V_{OUT}$ conductor 27. The emitter of transistor 23 is connected to the collector of NPN transistor 22, the base of which is connected to the base of transistor 24 and to $V_{IN}$ conductor 21. It can be seen that the bias circuit 1 serves as a $2V_{BE}$ level shifter to provide a bias voltage for the bases of transistors 23 and 25. The emitter of transistor 22 is connected to conductor 5A of bias circuit 1A of FIG. 1B. Conductor 5A also is connected to the base of PNP transistor 29, the emitter of which is connected to $V_{OUT}$ conductor 27 and the collector of which is connected to the emitter of PNP transistor 30. The other terminal 6A of bias circuit 1A is connected to the base of transistor 30, the collector of which is connected to $-V_{EE}$. The bias 25 circuit 1A thus acts as a $2V_{BE}$ level shifter to provide a bias voltage on the bases of transistors 28 and 30. This circuit maintains constant collector-to-base voltages of transistors 26 and 29 and therefore avoids high frequency distortion due to the non linearity of the collector-base junction capacitances of those transistors.

While the invention has been described with reference to several preferred embodiments thereof, those skilled in the art will be able to make various modifications to the disclosed embodiments without departing from the true spirit and scope of the invention.

What is claimed is:

1. A circuit for producing a reference voltage between a first terminal and a second terminal, comprising in combination:
    (a) a first transistor having an emitter connected to the first terminal, a base, and a collector connected to the second terminal;
    (b) a second transistor having an emitter connected to the second terminal, a base connected to the base of the first transistor, and a collector connected to the first terminal;
    (c) a current source coupled to one of the first and second terminals for producing a first current in the first transistor and a second current in the second transistor, a $V_{BE}$ voltage of the first transistor and a $V_{BE}$ voltage of the second transistor being thereby added to produce the reference voltage with a value equal to the sum of the amplitudes of the $V_{BE}$ voltages of the first and second transistors.

2. The circuit of claim 1 wherein the base of the first transistor is connected solely to the base of the second transistor.

3. The circuit of Claim 1 wherein there are no resistors connected between the base and collector of either the first transistor or the second transistor.

4. The circuit of Claim 1 wherein the first transistor is an NPN transistor and the second transistor is a PNP transistor.

5. The circuit of Claim 3 wherein a geometry of the first transistor and a geometry of the second transistor are selected to cause the first current to be substantially equal to the second current.

6. The circuit of Claim 3 wherein the current source is connected to the first terminal.

7. The circuit of Claim 4 wherein the current source is connected to the second terminal.

8. The circuit of Claim 1 wherein the first terminal is connected to a base of a PNP pulldown transistor having its emitter connected to a third terminal and the second terminal is connected to a base of a NPN pullup transistor having its emitter connected to the third terminal.

9. The circuit of Claim 8 wherein the current source is connected to the first terminal and an emitter follower transistor having a base connected to an input terminal has its emitter connected to the second terminal, the third terminal being an output terminal.

10. The circuit of claim 1 wherein there are no resistors connected between the base and collector of either the first NPN transistor or the first PNP transistor.

11. A circuit for producing a reference voltage between a first terminal and a second terminal, comprising in combination:
(a) a first transistor of a first conductivity type having a first current carrying electrode connected to the first terminal, a control electrode, and a second current carrying terminal connected to the second terminal;
(b) a second transistor of a second conductivity type having a first current carrying electrode connected to the second terminal, a control electrode connected to the control electrode of the first transistor, and a second current carrying electrode connected to the first terminal;
(c) a current source coupled to one of the first and second terminals for producing a first current in the first transistor and a second current in the second transistor, a first threshold voltage between the control electrode and first current carrying electrode of the first transistor being thereby added to a second threshold voltage between the control electrode and first current carrying electrode of the second transistor to produce the reference voltage with a value equal to the sum of the amplitudes of the first and threshold voltages.

12. A method for producing a reference voltage between first and second terminals, the method comprising the steps of:
(a) forcing a first current to flow into the first terminal and an emitter of a PNP transistor and a collector of an NPN transistor;
(b) causing a first part of the first current to flow into the emitter of the PNP transistor and producing a PNP $V_{BE}$ voltage between the emitter and a base of the PNP transistor in response to the first port of the first current;
(c) causing a base current flowing out of the base of the PNP transistor to flow into a base of an NPN transistor and producing an NPN $V_{BE}$ voltage between the base and an emitter of the NPN transistor in response to the base current to cause a second portion of the first current to flow from the first terminal into a collector of the NPN transistor;
(d) causing a collector current in the PNP transistor to flow into the second terminal and an emitter current in the NPN transistor to flow into the second terminal,
whereby the reference voltage is equal to the sum of the PNP $V_{BE}$ voltage and the NPN $V_{BE}$ voltage.

13. The method of Claim 12 including the step of using the reference voltage to produce a process-independent quiescent bias current in a push-pull transistor stage by connecting the first terminal to a base of an NPN pullup transistor having an emitter connected to an output terminal and connecting the second terminal to a base of a PNP pulldown transistor having an emitter connected to an output terminal, whereby the quiescent bias current through the NPN pullup transistor and the PNP pulldown transistor are essentially independent of process-induced variations in a PNP saturation current and an NPN saturation current.

14. A circuit for producing a reference voltage between first and second terminals, comprising in combination:
(a) an NPN transistor and a PNP transistor;
(b) means forcing a first current to flow into the first terminal and an emitter of the PNP transistor and a collector of the NPN transistor;
(e) means for conducting a first part of the first current into the emitter of the PNP transistor and producing a PNP $V_{BE}$ voltage between the emitter and a base of the PNP transistor in response to the first port of the first current;
(d) means for conducting a base current flowing out of the base of the PNP transistor into a base of an NPN transistor and producing an NPN $V_{BE}$ voltage between the base and an emitter of the NPN transistor in response to the base current;
(e) means for conducting a second portion of the first current to flow from the first terminal into a collector of the NPN transistor in response to the NPN $V_{BE}$ voltage;
(f) means for conducting a collector current in the PNP transistor to flow into the second terminal and means for conducting an emitter current in the NPN transistor to flow into the second terminal,
whereby the reference voltage is equal to the sum of the PNP $V_{BE}$ voltage and the NPN $V_{BE}$ voltage.

15. A circuit for producing a reference voltage between a first terminal and a second terminal, comprising in combination:
(a) a first NPN transistor having an emitter connected to the first terminal, a base, and a collector connected to the second terminal;
(b) a second NPN transistor having an emitter connected to the first terminal and a base and collector connected to the base of the first NPN transistor;
(c) a first PNP transistor having an emitter connected to the first terminal, a base connected to the base of the first NPN transistor, and a collector connected to the second terminal;
(d) a second PNP transistor having an emitter connected to the second terminal and a base and collector connected to the base of the first PNP transistor, each of the first and second NPN transistors and the first and second PNP transistors having a current gain, respectively;
(e) a current source coupled to one of the first and second terminals, the current gains of the first and second NPN transistors being matched, and the current gains of the first and second PNP transistors being matched, whereby a first current flowing through the collector of the first PNP transistor is independent of the current gain of the first PNP transistor and a second current flowing through the collector of the first NPN transistor is independent of the current gain of the first NPN transistor.

16. The circuit of claim 15 wherein the emitter areas of the second NPN transistor and the second PNP transistor are equal and are substantially smaller than the emitter areas of the first NPN transistor and the first PNP transistor.

17. A circuit for producing a reference voltage between a first terminal and a second terminal, comprising in combination:
   (a) a first transistor of a first conductivity type having a first current carrying electrode connected to the first terminal, a control electrode, and a second current carrying electrode connected to the second terminal;
   (b) a second transistor of the first conductivity type having a first current carrying electrode connected to the first terminal, and a control electrode and a second current carrying electrode connected to the control electrode of the first transistor of the first conductivity type;
   (c) a first transistor of a second conductivity type having a first current carrying electrode connected to the first terminal, a control electrode connected to the control electrode of the first transistor of the first conductivity type, and a second current carrying electrode connected to the second terminal;
   (d) a second transistor of the second conductivity type having a first current carrying electrode connected to the second terminal, and a control electrode and a second current carrying electrode connected to the control electrode of the first transistor of the second conductivity type, each of the first and second transistors of the first conductivity type having a gain parameter, each of the first and second transistors of the second conductivity type having a gain parameter;
   (e) a current source coupled to one of the first and second terminals, the gain parameters of the first and second transistors of the fist conductivity type being matched, and the gain parameters of the first and second transistors of the second conductivity type being matched, whereby a first current flowing through the second current carrying electrode of the first transistor of the second conductivity type is independent of the gain parameter of the first transistor of the second conductivity type and a second current flowing through the second current carrying electrode of the first transistor of the first conductivity type is independent of the gain parameter of the first transistor of the first conductivity type.

* * * * *